United States Patent
Huang

(10) Patent No.: US 12,500,600 B2
(45) Date of Patent: Dec. 16, 2025

(54) DIGITAL-TO-ANALOG CONVERTER AND ELECTRONIC DEVICE

(71) Applicant: HUAWEI TECHNOLOGIES CO., LTD., Guangdong (CN)

(72) Inventor: Xin Huang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 253 days.

(21) Appl. No.: 18/344,323

(22) Filed: Jun. 29, 2023

(65) Prior Publication Data
US 2023/0344443 A1 Oct. 26, 2023

Related U.S. Application Data

(63) Continuation of application No. PCT/CN2020/142247, filed on Dec. 31, 2020.

(51) Int. Cl.
*H03M 1/74* (2006.01)

(52) U.S. Cl.
CPC ..................................... *H03M 1/74* (2013.01)

(58) Field of Classification Search
CPC ....... H03M 1/74; H03M 1/742; H03M 1/0678
See application file for complete search history.

(56) References Cited

U.S. PATENT DOCUMENTS

| | | | | |
|---|---|---|---|---|
| 5,483,150 A | * | 1/1996 | Elliott | G05F 3/205 323/312 |
| 6,331,830 B1 | * | 12/2001 | Song | H03M 1/1057 341/120 |
| 6,417,793 B1 | * | 7/2002 | Bugeja | H03M 1/1057 341/143 |
| 6,897,798 B1 | * | 5/2005 | Bicakci | H03M 1/0678 341/118 |

(Continued)

FOREIGN PATENT DOCUMENTS

CN 107153719 A 9/2017

OTHER PUBLICATIONS

Geert Van Der Plas et al. "Layout Synthesis Methodology for Array-Type Analog Blocks" Jun. 1, 2002, IEEE vol. 21, No. 6, XP011070601, ISSN:0278-0070, IEEE Transactions on Computer-Aided Design of Integrated Circuit and Systems, IEEE, USA. (Year: 2002).*

(Continued)

*Primary Examiner* — Lam T Mai
(74) *Attorney, Agent, or Firm* — Fish & Richardson P.C.

(57) ABSTRACT

Embodiments of this application provide example digital-to-analog converters and electronic devices, and relate to the field of electronic technologies. The digital-to-analog converter includes a current source array and a switch array, and the current source array includes a plurality of active current source units. A metal is filled above the plurality of active current source units. The switch array includes a plurality of (Continued)

Virtually connected current source unit

Active current source unit

Active current source unit above which a metal is filled switch units. Control ends of the plurality of switch units are configured to receive control signals, and input ends of the plurality of switch units are respectively configured to receive corresponding currents provided by the plurality of active current source units. Output ends of the plurality of switch units are coupled to an output end of the digital-to-analog converter, and are configured to output analog signals.

20 Claims, 10 Drawing Sheets

(56) References Cited

U.S. PATENT DOCUMENTS

| | | | | |
|---|---|---|---|---|
| 7,042,374 | B1* | 5/2006 | Manganaro | H03M 1/1057 341/120 |
| 7,561,087 | B2* | 7/2009 | Mechnig | H03M 1/08 375/296 |
| 8,471,739 | B2* | 6/2013 | Choi | H03M 1/0653 341/120 |
| 9,350,372 | B2* | 5/2016 | Chang | H03M 1/0827 |
| 9,800,259 | B1 | 10/2017 | Chou et al. | |
| 9,991,900 | B1* | 6/2018 | Kabir | H03M 1/0673 |
| 10,454,487 | B1* | 10/2019 | Sedighi | H03M 1/742 |
| 10,840,929 | B1* | 11/2020 | Weil | H03M 1/1009 |
| 2007/0126616 | A1* | 6/2007 | Cho | H03M 1/0673 341/144 |
| 2007/0146182 | A1* | 6/2007 | Chen | H03M 1/1061 341/120 |
| 2008/0252501 | A1* | 10/2008 | Mechnig | H03M 1/08 341/143 |
| 2009/0224953 | A1* | 9/2009 | Seo | H03M 1/066 327/334 |
| 2012/0161993 | A1* | 6/2012 | Choi | H03M 1/0653 341/120 |
| 2014/0159932 | A1* | 6/2014 | Chang | H03M 1/0827 341/144 |
| 2014/0167988 | A1* | 6/2014 | Hong | H03M 1/1061 341/110 |
| 2015/0048961 | A1* | 2/2015 | Schafferer | H03M 1/74 341/145 |
| 2015/0171878 | A1* | 6/2015 | Schafferer | H03M 1/747 375/297 |
| 2018/0160368 | A1* | 6/2018 | Wu | H04W 52/0209 |
| 2021/0125941 | A1* | 4/2021 | Delshadpour | G05F 1/561 |
| 2022/0190839 | A1* | 6/2022 | Yang | H03M 1/0643 |

OTHER PUBLICATIONS

IEEE vol. 22, No. 6 Jun. 1, 2002, A layout Synthesis Methodology for Array-Type Analog (Year: 2002).*

Van Der Plas et al., "A Layout Synthesis Methodology for Array-Type Analog Blocks," IEEE Transactions on Computer-Aided Design of Integrated Circuits and Systems, vol. 21 , No. 6, Jun. 1, 2002, 17 pages.

Bastos et al., "12-Bit Intrinsic Accuracy High-Speed CMOS DAC," IEEE Journal of Solid-State Circuits, vol. 33, No. 12, Dec. 1, 1998, pp. 1959-1969.

Extended European Search Report in European Appln. No. 20967776. 4, mailed on Jan. 16, 2024, 9 pages.

Van Der Plas et al., "A Layout Synthesis Methodology for Array-Type Analog Blocks," IEEE Transactions on Computer-Aided Design of Integrated Circuits and Systems, vol. 21, No. 6, Jun. 2002, 17 pages.

Bastos et al., "A 12-Bit Intrisic Accuracy High-Speed CMOS DAC," IEEE Journal of Solid-State Circuits, vol. 33, No. 12, Dec. 1998, 11 pages.

International Search Report and Written Opinion in International Appln. No. PCT/CN2020/142247, mailed on Sep. 28, 2021, 18 pages (with English translation).

Extended European Search Report in European Appln No. 20967776. 4, dated Jan. 16, 2024, 9 pages.

* cited by examiner

Virtually connected current source unit

Active current source unit

Virtually connected current source unit

Active current source unit

Active current source unit above which a metal is filled

Virtually connected current source unit

Active current source unit

Active current source unit above which a metal is filled

DIGITAL-TO-ANALOG CONVERTER AND ELECTRONIC DEVICE

CROSS-REFERENCE TO RELATED APPLICATIONS

This application is a continuation of International Application No. PCT/CN2020/142247, filed on Dec. 31, 2020, the disclosure of which is hereby incorporated by reference in its entirety.

TECHNICAL FIELD

This application relates to the field of electronic technologies, and in particular, to a digital-to-analog converter and an electronic device.

BACKGROUND

In a modern communication system, to meet signal processing speed and precision requirements, an integrated circuit such as a high-performance digital-to-analog converter (DAC) is required to implement signal processing and conversion. In many application scenarios, an area of the integrated circuit may be designed to be large due to a performance requirement (such as noise and linearity).

For a circuit including a plurality of matched unit structures, such as a digital-to-analog converter (DAC) current source, a matching characteristic of the circuit brings a great challenge to design of the DAC.

SUMMARY

Embodiments of this application provide a digital-to-analog converter and an electronic device, to improve circuit matching performance of an integrated circuit such as a current digital-to-analog converter.

To achieve the foregoing objective, the following technical solutions are used in this application.

According to a first aspect, this application provides a digital-to-analog converter. The digital-to-analog converter includes a current source array and a switch array, and the current source array includes a plurality of active current source units. A metal is filled above the plurality of active current source units. The switch array includes a plurality of switch units. Control ends of the plurality of switch units are configured to receive control signals. Input ends of the plurality of switch units are configured to receive currents provided by the plurality of active current source units. Output ends of the plurality of switch units are coupled to an output end of the digital-to-analog converter, and are configured to output analog signals. The active current source unit is a current source unit that is in the current source array in the digital-to-analog converter and that can generate an electrical signal and contribute to an output of an analog signal and precision and performance of the digital-to-analog converter.

Based on the digital-to-analog converter provided in the first aspect, the digital-to-analog converter includes a plurality of active current source units, and a metal is filled over the plurality of active current source units. In an advanced process, a metal filling density in a circuit layout design has a strict requirement, and filling a metal above the plurality of active current source units can meet the requirement on the metal filling density in the circuit layout design, thereby improving circuit matching performance of the digital-to-analog converter.

Optionally, the current source array may further include a plurality of virtually connected current source units. A metal is filled above the virtually connected current source units. The virtually connected current source unit is a region that is additionally disposed for stability of a circuit layout and consistency of a layout environment near an active unit, and is not configured to generate an electrical signal. Therefore, the virtually connected current source unit generally does not directly affect precision and performance of the digital-to-analog converter. Because a metal is filled above the active current source units, the metal may generate stress on transistors on the active current source units, and a metal is filled above the virtually connected current source units, so that an impact of the stress generated by the metal on the transistors on the active current source units may be reduced while the requirement on the metal density in the circuit layout design is met, thereby improving performance of the digital-to-analog converter.

Further, the metal filled above the active current source units may include a top layer metal and/or a sub-top layer metal. In the circuit layout design of the digital-to-analog converter, there is a specific requirement on the metal filling density at each metal layer in the circuit layout. A high-layer thick metal is a top layer metal and/or a sub-top layer metal in the circuit layout, and the high-layer thick metal is generally thick, and may generate stress on a lower-layer transistor device, thereby changing an electrical matching relationship of an original circuit.

Further, the plurality of active current source units may have a weight proportional relationship, and a weight of each active current source unit may be related to a quantity of transistors in the active current source unit or sizes of the transistors. According to a basic principle of the digital-to-analog converter DAC, a plurality of current source units in the current source array have a weight proportional relationship. However, because the virtually connected current source units in the current source array are not configured to generate an electrical signal, that a plurality of current source units in the current source array have a weight proportional relationship means that the plurality of active current source units in the current source array have a weight proportional relationship. In addition, weights of the plurality of current source units in the current source array are determined based on an electrical parameter (such as a current and a voltage) outputted by each current source unit, and a quantity of transistors in each current source unit determines a magnitude of the electrical parameter outputted by each current source unit. The quantity of transistors determines a total size of the current source unit, that is, the weight of each active current source unit is related to the quantity of transistors or the total size of transistors in the active current source unit.

Further, the plurality of switch units may have a weight proportional relationship, and weights of the plurality of switch units are related to a quantity of transistors in the plurality of switch units or sizes of the transistors. The weight proportional relationship between the switch units may be consistent with the weight proportional relationship between the active current source units. For a relationship between the weights of the switch units and the quantity of the transistors in the switch units or the sizes of the transistors, refer to the foregoing relationship between the weights of the plurality of active current source units and the quantity of the transistors in the active current source units or the sizes of the transistors. Details are not described herein again.

In a possible implementation, the current source array may include a first active current source unit and a second active current source unit. The first active current source unit has a first weight, and the second active current source unit has a second weight. The first weight is greater than or equal to the second weight. At a same metal layer, a metal filling area on the first active current source unit is greater than or equal to a metal filling area on the second active current source unit. In this way, a mismatch error caused by non-uniform stress generated by the high-layer thick metal can be reduced, thereby improving circuit matching performance and precision of the digital-to-analog converter.

Further, at a same metal layer, a proportional relationship between the metal filling area on the first active current source unit and the metal filling area on the second active current source unit may be consistent with a proportional relationship between the first weight and the second weight. In this way, a mismatch error caused by stress generated by a metal filled above the first active current source unit and the second active current source unit on a lower transistor device can also meet the proportional relationship between the first weight and the second weight, so that after the mismatch error is generated due to the stress, the first active current source unit and the second active current source unit may still maintain an original weight proportional relationship, thereby further improving circuit matching performance and precision of the digital-to-analog converter DAC.

Optionally, the current source array may further include a third active current source unit, and the third active current source unit has a third weight. The third weight is less than the second weight. At a same metal layer, a metal filling area on the third active current source unit is less than the metal filling area on the second active current source unit. In this way, a mismatch error caused by non-uniform stress generated by the high-layer thick metal can be reduced, thereby improving precision and performance of the digital-to-analog converter.

Further, at a same metal layer, a proportional relationship between the metal filling area on the first active current source unit, the metal filling area on the second active current source unit, and the metal filling area on the third active current source unit may be consistent with a proportional relationship between the first weight, the second weight, and the third weight. In this way, a mismatch error caused by stress generated by a metal filled above the first active current source unit, the second active current source unit, and the third active current source unit on a lower transistor device can also meet the proportional relationship between the first weight, the second weight, and the third weight, so that after the mismatch error is generated due to the stress, the first active current source unit, the second active current source unit, and the third active current source unit may still maintain an original weight proportional relationship, thereby further improving circuit matching performance and precision of the digital-to-analog converter DAC.

Optionally, the proportional relationship between the first weight, the second weight, and the third weight may be a binary proportional relationship.

Optionally, a metal filling manner on the active current source units may be strip-shaped cover filling and/or dot-shaped filling. The strip-shaped cover filling is more convenient for metal filling and manufacturing, thereby reducing manufacturing costs; and the dot-shaped filling can make the generated stress more uniform and improve performance of the digital-to-analog converter.

Optionally, if a layout area of the current source array exceeds a first threshold, a proportion of a total area of the metals filled above the plurality of active current source units and the plurality of virtually connected current source units to the layout area of the current source array is at least 5%. In this way, an integrated circuit such as the digital-to-analog converter DAC can meet a basic requirement of an integrated circuit process in a manufacturing process, and circuit matching performance and reliability of the digital-to-analog converter can be improved.

According to a second aspect, this application provides an integrated circuit. The integrated circuit includes any possible digital-to-analog converter in the first aspect. It should be understood that the integrated circuit may be any possible digital-to-analog converter in the first aspect, or may both include any possible digital-to-analog converter in the first aspect, and include another type of circuit, such as an analog-to-digital converter (ADC). Therefore, for beneficial effects of the integrated circuit, refer to the beneficial effects of the digital-to-analog converter provided in the first aspect. Details are not described herein again.

According to a third aspect, this application provides an electronic device. The electronic device includes: a transceiver chip, and any possible digital-to-analog converter in the first aspect. The digital-to-analog converter may be disposed in the transceiver chip.

Optionally, the electronic device may further include a baseband processing chip, and the baseband processing chip is coupled to the transceiver chip.

Optionally, the electronic device further includes a printed circuit board, and the transceiver chip and the baseband processing chip are disposed on the printed circuit board.

It may be understood that the electronic device in the third aspect of this application relates to the digital-to-analog converter provided in the first aspect. Therefore, for beneficial effects that can be achieved by the electronic device, refer to the beneficial effects of the digital-to-analog converter provided in the first aspect. Details are not described herein again.

DESCRIPTION OF EMBODIMENTS

The following describes the technical solutions in embodiments of this application with reference to the accompanying drawings in embodiments of this application. Apparently, the described embodiments are merely some rather than all of embodiments of this application.

In the following, the terms "first" and "second" are merely used for a purpose of description, and shall not be understood as indicating or implying relative importance or implicitly specifying a quantity of indicated technical features. Therefore, a feature defined by "first" or "second" may explicitly or implicitly include one or more features.

In addition, in this application, orientation terms such as "up", "down", "left", "right", "horizontal", and "vertical" are defined relative to an orientation in which components are schematically placed in the accompanying drawings. It should be understood that, these directional terms are relative concepts that are used for relative description and clarification, and may vary accordingly based on changes of the orientation in which the components are placed in the accompanying drawings.

Figure 1:
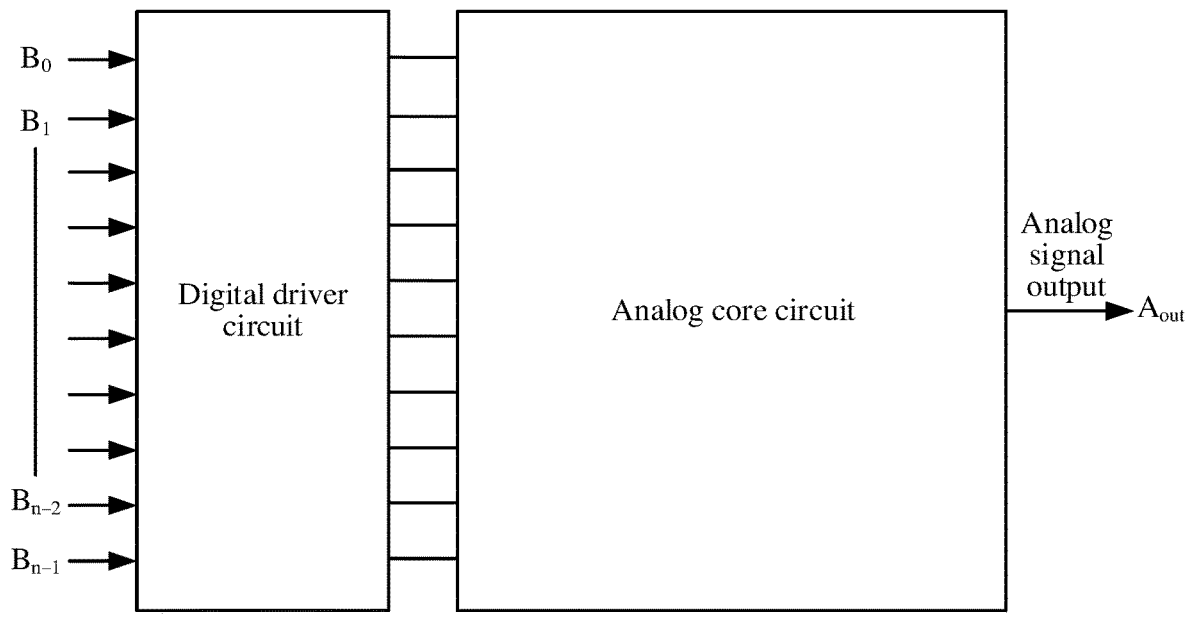
FIG. 1 is a schematic diagram of a circuit principle of a digital-to-analog converter DAC according to an embodiment of this application.

FIG. 1 shows a basic principle of a digital-to-analog converter (DAC). Refer to FIG. 1. The DAC includes a digital driver circuit and an analog core circuit. The digital drive circuit receives inputs of digital signals $B_0, B_1, \ldots, B_{n-2}$, and $B_{n-1}$. The analog core circuit includes a plurality of matching circuit units, and different matching circuit units may have different weights. That is, the plurality of different circuit units respectively have weights $W_0, W_1, \ldots, W_{n-2}$, and $W_{n-1}$. After the digital signals $B_0, B_1, \ldots, B_{n-2}$, and $B_{n-1}$ are inputted into the digital drive circuit, the digital signals $B_0, B_1, \ldots, B_{n-2}$, and $B_{n-1}$ are combined with different circuit units in the analog core circuit to output analog signals (voltages and currents). The outputted analog signal Aout may be represented by the following Formula 1:

$$A_{out} = \Sigma_{m=0}^{n-1} B_m W_m R_{ref} \quad \text{(Formula 1)}$$

$R_{ref}$ represents a reference (which may be a voltage, a current, or a charge quantity).

Currently, a circuit matching characteristic brings a great challenge to a design of a digital-to-analog converter DAC. For the digital-to-analog converter DAC, the circuit matching characteristic may refer to matching that meets a metal density filling requirement in a circuit layout design, or may refer to matching performance of a weight proportion relationship in the matching circuit units.

The following describes how to improve a circuit matching characteristic of a circuit layout of a digital-to-analog converter DAC.

Figure 2:
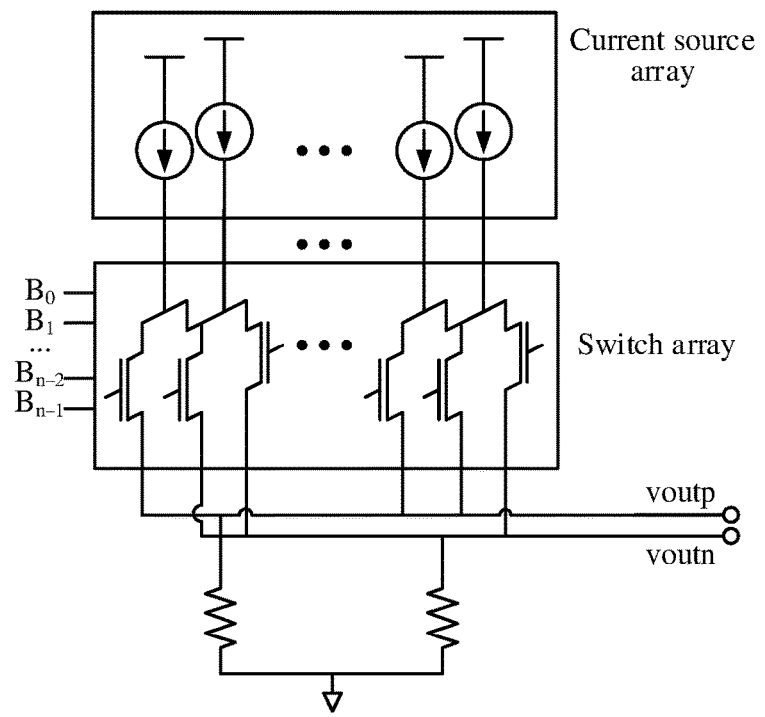
FIG. 2 is a schematic diagram of a structure of a current steering DAC according to an embodiment of this application.

For example, FIG. 2 shows a schematic diagram of a structure of a current steering DAC according to an embodiment of this application. Refer to FIG. 2. A current steering DAC includes a current source array and a switch array. The switch array includes a plurality of switch units. Control ends of the plurality of switch units are configured to receive control signals. Input ends of the plurality of switch units are respectively configured to receive corresponding currents provided by a plurality of active current source units. Output ends of the plurality of switch units are coupled to an output end of the digital-to-analog converter, and are configured to output analog signals. That is, the current source array may be used as an analog core circuit in the current steering DAC. A plurality of current source units in the current source array have a weight relationship, and the plurality of current source units are in a one-to-one correspondence with differential switches (namely, switch units) that have a same weight in the switch array. Under control of the inputted digital signals $B_0, B_1 \ldots B_{n-2}$, and $B_{n-1}$, a current flowing to two-phase loads is determined to output analog signals.

Figure 3:
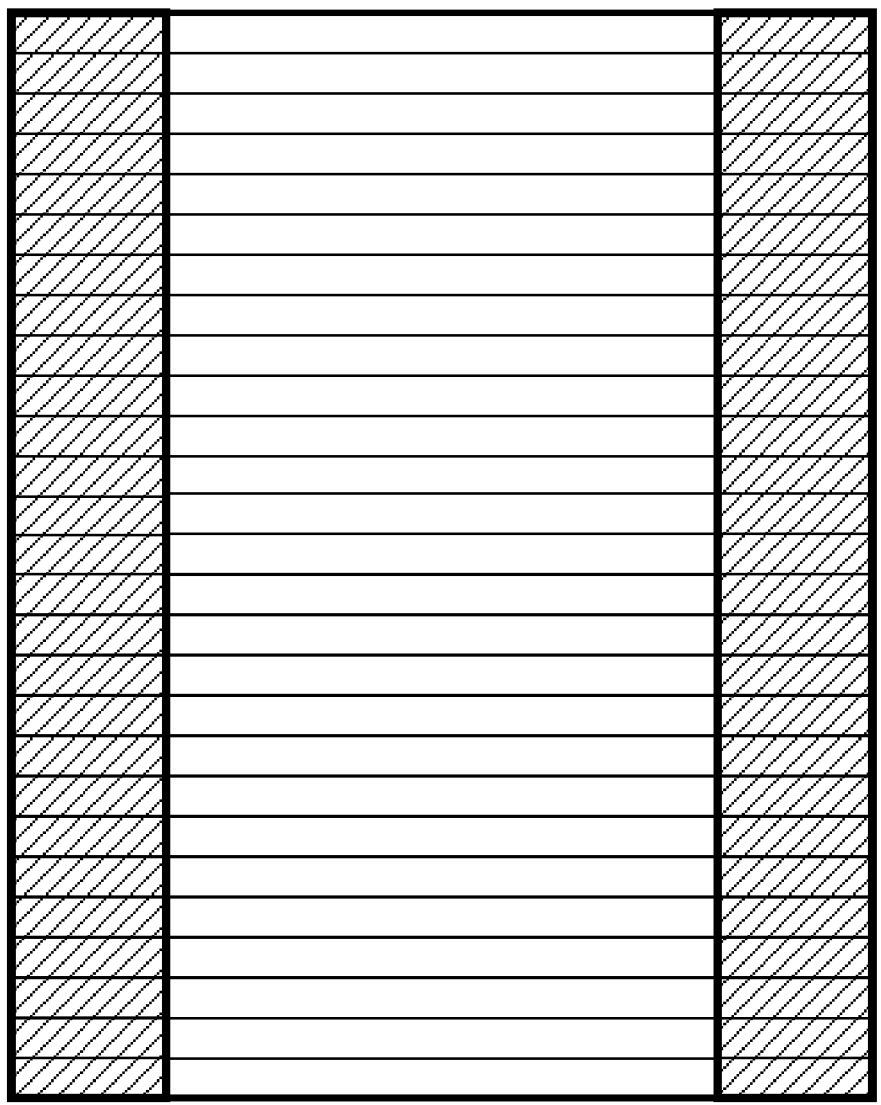
FIG. 3 is a schematic diagram of a circuit layout of a current source array in a current steering DAC according to an embodiment of this application.
Figure 3:
Figure 3:

FIG. 3 shows a schematic diagram of a circuit layout of a current source array in a current steering DAC according to an embodiment of this application. Refer to FIG. 3. A current source array includes a plurality of active current source units and a plurality of virtually connected current source units. The active current source unit is a current source unit that is in the current source array in the digital-to-analog converter and that can generate an electrical signal and contribute to an output of an analog signal and precision and performance of the digital-to-analog converter. The virtually connected current source unit is a region that is additionally disposed for stability of a circuit layout and consistency of a layout environment near an active unit, and is not configured to generate an electrical signal. Therefore, the virtually connected current source unit generally does not directly affect precision and performance of the digital-to-analog converter. A middle blank region in FIG. 3 is the plurality of active current source units, and parts on two sides of the active current source units are the virtually connected current source units.

Figure 4:
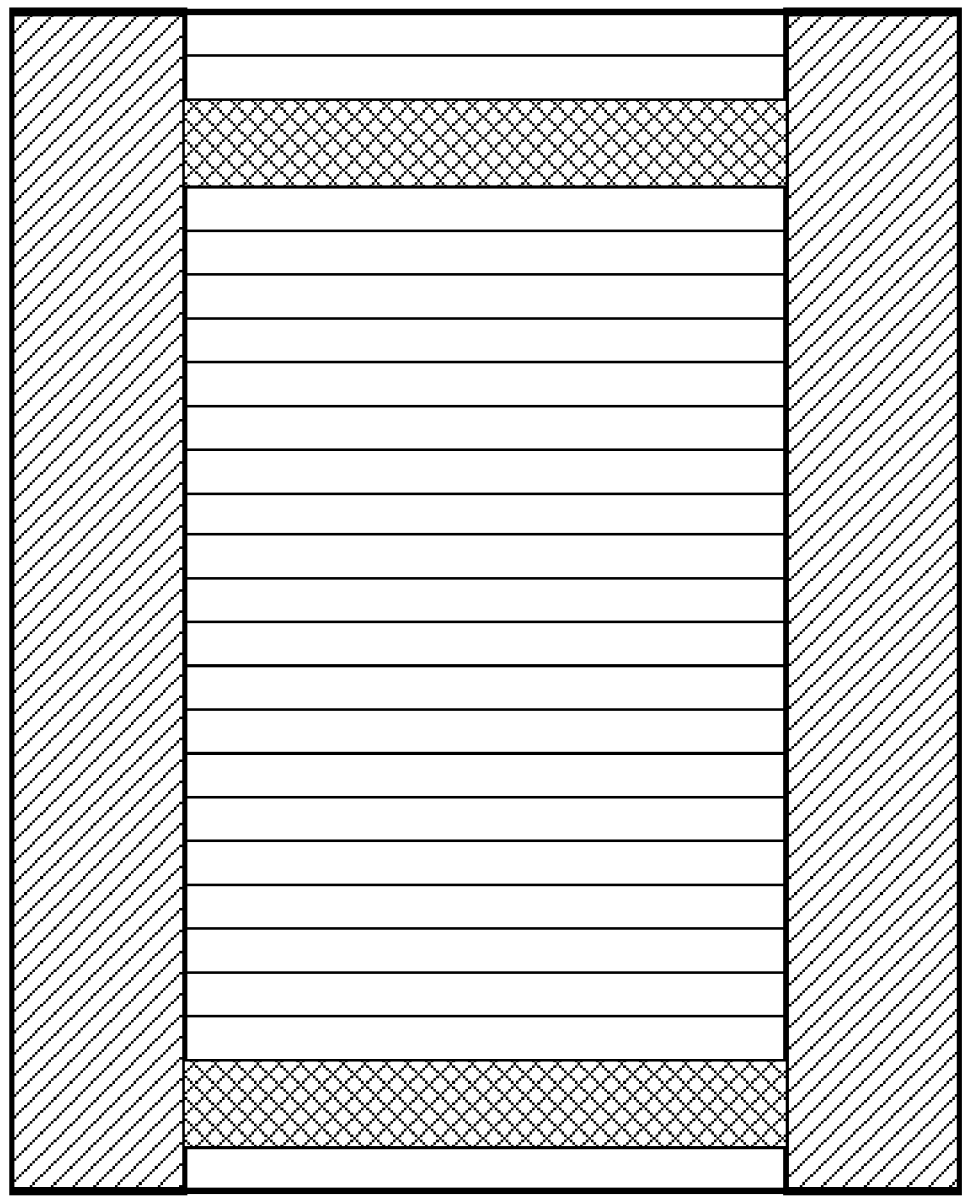
FIG. 4 is a schematic diagram 1 of filling a high-layer thick metal on a digital-to-analog converter DAC according to an embodiment of this application.
Figure 4:
Figure 4:
Figure 4:
Figure 6:
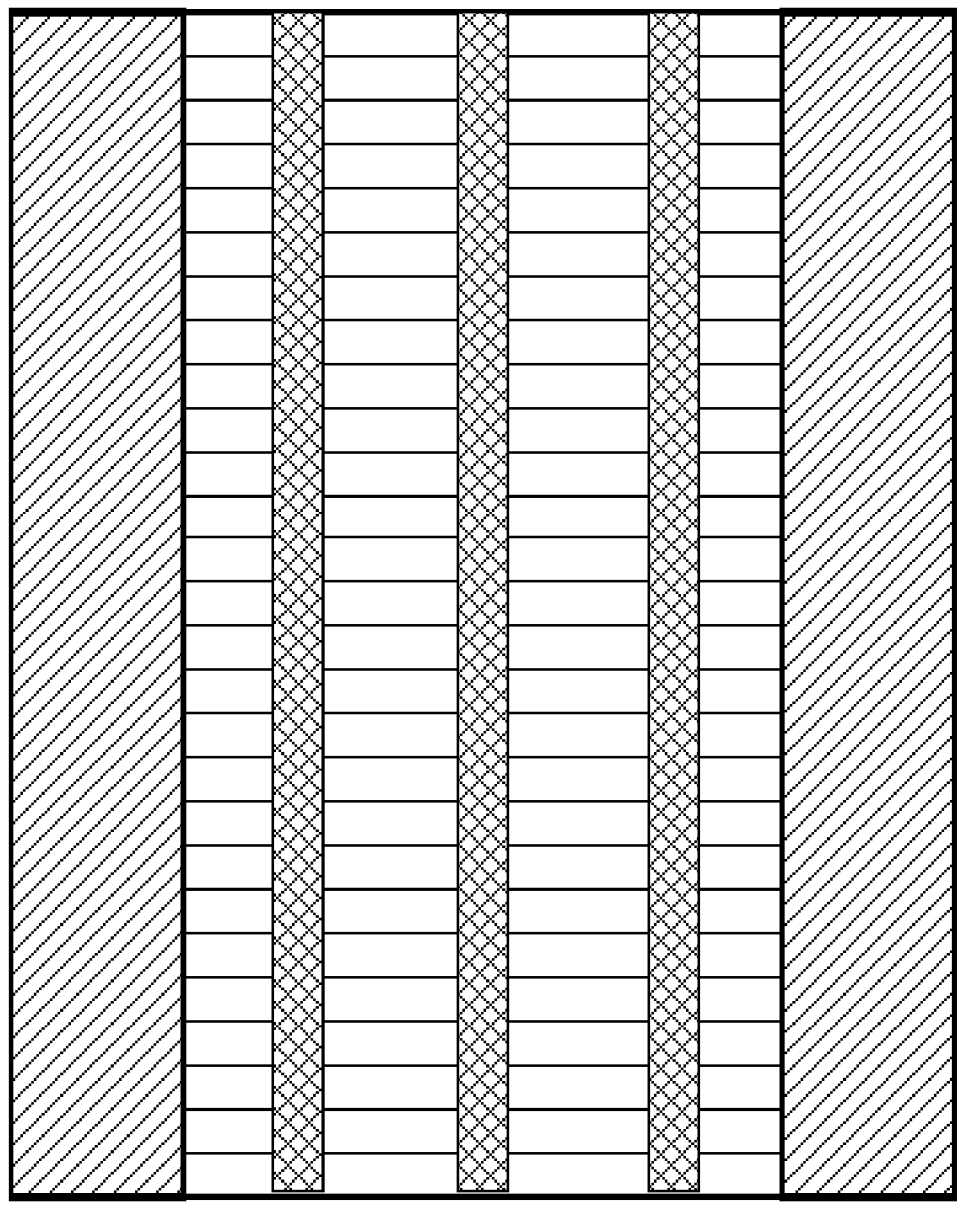
FIG. 6 is a schematic diagram 2 of filling a high-layer thick metal on a digital-to-analog converter DAC according to an embodiment of this application.
Figure 6:
Figure 6:
Figure 6:

With reference to FIG. 3, refer to FIG. 4 and FIG. 6. In a layout range of the digital-to-analog converter DAC, the plurality of active current source units are filled with a metal. In an advanced process, in a circuit layout design of the digital-to-analog converter, there is a strict requirement on a metal filling density at each metal layer in the circuit layout. Filling a metal above the plurality of active current source units can meet the requirement on the metal filling density in the circuit layout design of the digital-to-analog converter, thereby improving circuit matching performance of the digital-to-analog converter.

In addition to filling a metal on the plurality of active current source units, a metal may be also filled above the plurality of virtually connected current source units. Because a metal is filled above the active current source units, the metal may generate stress on transistors on the active current source units, and a metal is filled above the virtually connected current source units, so that an impact of the stress generated by the metal on the transistors on the active current source units may be reduced while the requirement on the metal density in the circuit layout design is met, thereby improving matching performance of the digital-to-analog converter.

Optionally, in the current steering DAC shown in FIG. 2, the plurality of current source units in the current source array may have a weight relationship. However, the current source array includes a plurality of active current source units and a plurality of virtually connected current source units. The virtually connected current source units in the current source array are mainly used for ensuring stability (structure strength) of the integrated circuit layout and consistency of a layout environment near the active units, and are not used for generating a corresponding electrical parameter. Therefore, that the plurality of current source units in the current source array have a weight relationship may be that the plurality of active current source units have a weight proportional relationship.

It may be understood that, because weights of the plurality of current source units in the current source array are determined based on an electrical parameter (such as a current and a voltage) outputted by each current source unit, and a quantity of transistors in each current source unit determines a magnitude of the electrical parameter outputted by each current source unit. Therefore, it may be considered that a weight of each active current source unit is positively correlated with a quantity of transistors in the active current source unit. In addition, because a larger quantity of transistors in the current source unit indicates a larger layout size occupied by the current source unit, it may also be considered that the weight of each active current source unit is positively correlated with a total size of the transistors in the active current source.

Correspondingly, the plurality of switch units may have a weight proportional relationship, and weights of the plurality of switch units are related to a quantity of transistors in the plurality of switch units or sizes of the transistors. The weight proportional relationship between the switch units may be consistent with the weight proportional relationship between the active current source units. For a relationship between the weights of the switch units and the quantity of the transistors in the switch units or the sizes of the transistors, refer to the foregoing relationship between the weights of the plurality of active current source units and the quantity of the transistors in the active current source units or the sizes of the transistors. Details are not described herein again.

It should be noted that, the thickness of metals at different metal layers is different. A high-layer thick metal is a top layer metal and/or a sub-top layer metal in the circuit layout, and the high-layer thick metal is generally thick, and may generate stress on a lower-layer transistor device, thereby changing an electrical matching relationship of an original circuit. Filling of a high-layer thick metal in a DAC circuit layout is mainly discussed in this embodiment of this application. Therefore, the metal filled above the active current source units may include a top layer metal and/or a sub-top layer metal.

In addition, it should be further noted that, when the metal filled above the active current source units is a top layer metal or a sub-top layer metal, the thickness of the metal is generally large, and after the metal is filled, the metal generates stress on the lower-layer transistor device. The stress changes an original physical characteristic (such as a threshold voltage and a threshold current) of the device, thereby changing an electrical parameter (such as a voltage and a current) in a DAC circuit, thereby reducing precision and performance of the digital-to-analog converter DAC.

For example, the following describes an impact of the stress generated by the high-layer thick metal on the digital-to-analog converter DAC.

In a first case, FIG. 4 shows a schematic diagram 1 of filling a high-layer thick metal on a digital-to-analog converter DAC according to an embodiment of this application. Refer to the schematic diagram in FIG. 4. The high-layer thick metal is filled only on a part of active current source units of the digital-to-analog converter DAC. Because the high-layer thick metal generates stress on a lower-layer transistor device, the part of active current source units is greatly affected by the stress. Due to an impact of the stress, a weight proportional relationship between a plurality of active current source units in the digital-to-analog converter DAC changes, and an original weight proportional relationship cannot be remained. As a result, a serious mismatch error is caused, and precision and circuit matching performance of the digital-to-analog converter DAC are further reduced.

Figure 5:
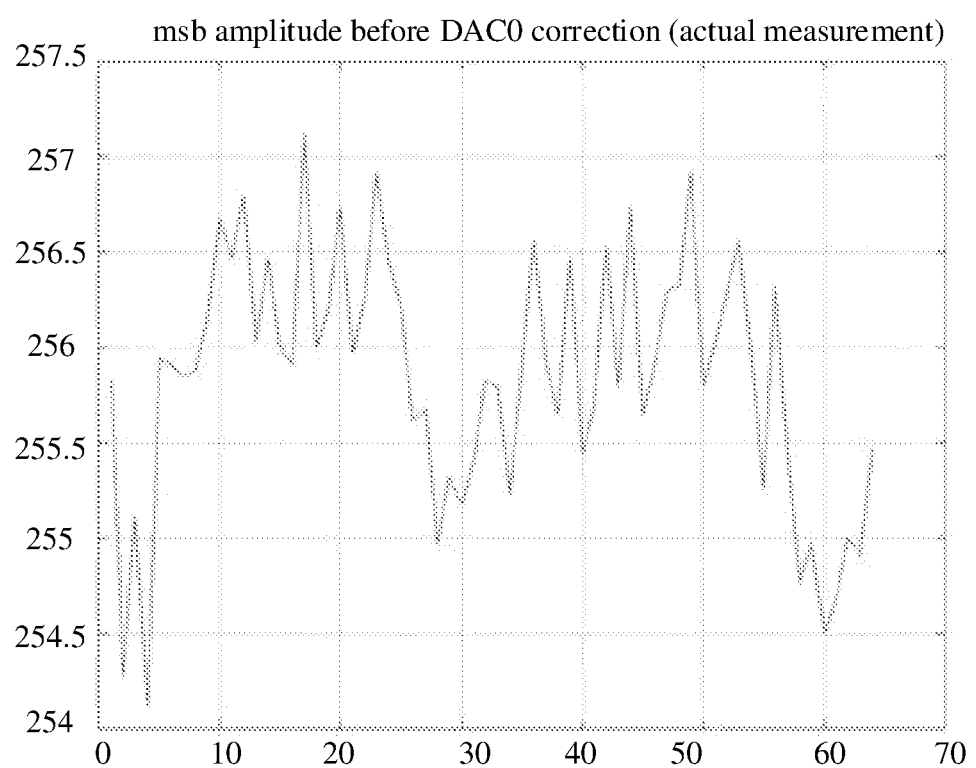
FIG. 5 is a curve diagram of a digital-to-analog converter DAC affected by stress according to an embodiment of this application.

FIG. 5 shows a curve diagram of a current steering DAC affected by stress. With reference to FIG. 4, refer to FIG. 5. In FIG. 5, a horizontal coordinate is a number of an active current source unit, and a vertical coordinate is a magnitude of an electrical parameter (for example, a magnitude of a current) generated by the active current source unit. The active current source units in the current steering DAC in FIG. 5 is designed according to a normalized current magnitude of 256, and a metal is filled above current sources whose active current source numbers are 2, 4, and 60. It can be learned from the figure that currents generated by the current sources whose active current source numbers are 2, 4, and 60 have maximized offsets from the preset value 256. Therefore, an active current source above which a metal is filled is more apparently affected by stress. The metal filled above the active current source unit may generate non-uniform stress on the lower transistor device.

In a second case, FIG. 6 shows a schematic diagram 2 of filling a high-layer thick metal on a digital-to-analog converter DAC according to an embodiment of this application. Refer to FIG. 6. The high-layer thick metal with a same area is filled on each active current source unit of the digital-to-analog converter DAC. In this case, the high-layer thick metal generates same stress on a lower-layer transistor device of each active current source unit. If a weight proportion of each active current source unit is the same, a mismatch error generated on each active current source unit is also the same under an impact of the same stress generated by the high-layer thick metal on the lower-layer transistor device. The weight proportion of each active current source unit may still maintain an original weight proportional relationship, so that precision and a circuit matching characteristic of the digital-to-analog converter DAC may not be reduced.

On the contrary, if the weight proportion of each active current source unit is different (for example, a binary proportional relationship or a linear proportional relationship), the mismatch error generated on each active current source unit is also the same under the impact of the same stress generated by the high-layer thick metal on the lower-layer transistor device. Therefore, the weight proportion of each active current source unit cannot maintain the original weight proportional relationship, and precision and circuit performance of the digital-to-analog converter DAC are further reduced. For example, one digital-to-analog converter DAC includes three active current source units, and a weight proportion of the three active current source units is 4:2:1. Assuming that the mismatch error caused by the stress generated by the high-layer thick metal on each active current source unit is 0.2, considering the impact of the stress, the weight proportion of the three active current source units in the digital-to-analog converter DAC changes to (4+0.2):(2+0.2):(1+0.2)=4.2:2.2:1.2.

Therefore, when the high-layer thick metal is filled on the active current source units in the circuit layout of the digital-to-analog converter DAC, non-uniform stress may be generated, and the non-uniform stress may damage an original weight matching relationship of the integrated circuit, thereby causing a mismatch error, and further reducing precision of the digital-to-analog converter DAC and deteriorating performance of the DAC.

The following describes how to reduce the mismatch error caused by the non-uniform stress generated by the high-layer thick metal.

In some embodiments, the digital-to-analog converter DAC shown in FIG. 2 may include a first active current source unit and a second active current source unit. The first active current source unit has a first weight, and the second active current source unit has a second weight. To reduce the mismatch error caused by the non-uniform stress generated by the high-layer thick metal, if the first weight is greater than or equal to the second weight, at a same metal layer, a metal filling area on the first active current source unit may be greater than or equal to a metal filling area on the second active current source unit.

Further, at the same metal layer, a proportional relationship between the metal filling area on the first active current source unit and the metal filling area on the second active current source unit may be made consistent with a proportional relationship between the first weight and the second weight. For example, assuming that a proportion of the first weight to the second weight is 2:1, a proportion of the metal filling area on the first active current source unit to the metal filling area on the second active current source unit may also be set to 2:1. In this way, after the high-layer thick metal is filled on the first active current source unit and the second active current source unit, after considering the mismatch error caused by the stress generated by the high-layer thick metal, the weight proportion of the first active current source unit to the second active current source unit may still maintain the original proportion such as 2:1, thereby reducing the mismatch error caused by the non-uniform stress, and improving precision and performance of the digital-to-analog converter DAC.

Optionally, the digital-to-analog converter DAC shown in FIG. 2 may further include a third active current source unit, and the third active current source unit has a third weight. Similarly, to reduce the mismatch error caused by the non-uniform stress generated by the high-layer thick metal, if the third weight is less than the second weight, at a same metal layer, a metal filling area on the third active current source unit may be less than the metal filling area on the second active current source unit.

Further, at a same metal layer, a proportional relationship between the metal filling area on the first active current source unit, the metal filling area on the second active current source unit, and the metal filling area on the third active current source unit is consistent with a proportional relationship between the first weight, the second weight, and the third weight. For example, assuming that a proportion of the first weight, the second weight and the third weight is 4:2:1, a proportion of the metal filling area on the first active current source unit, the metal filling area on the second active current source unit, and the metal filling area on the third active current source unit may also be set to 4:2:1, which further reduces the mismatch error caused by the non-uniform stress and improves precision and performance of the digital-to-analog converter DAC.

Figure 7:
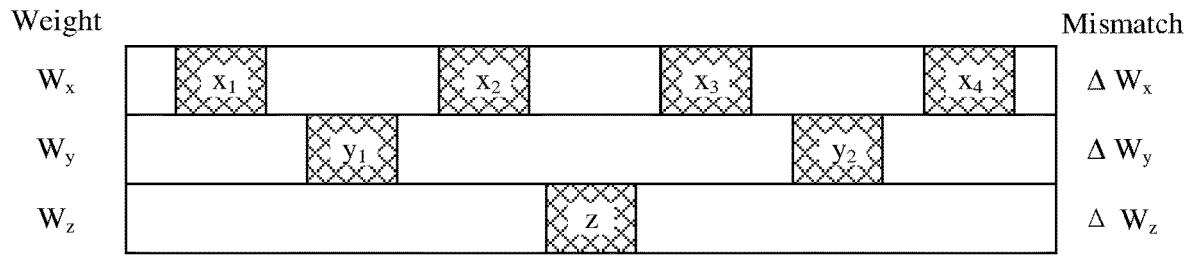
FIG. 7 is a principle diagram 1 of filling a high-layer thick metal on a digital-to-analog converter DAC according to an embodiment of this application.

Specifically, FIG. 7 shows a principle diagram 1 of filling a high-layer thick metal on a digital-to-analog converter DAC according to an embodiment of this application. Refer to FIG. 7. A digital-to-analog converter DAC may include three active current source units, and weights of the three active current source units are respectively $W_x$, $W_y$, and $W_z$. Mismatch errors generated by high-layer thick metals filled above the three active current source units are respectively $\Delta W_x$, $\Delta W_y$, and $\Delta W_z$.

Assuming that a density (for example, a current density) of a physical size of each active current source unit in a circuit layout is consistent, and a filling area proportion relationship of the high-layer thick metal above the three active current source units is the same as a weight proportional relationship between the three active current source units. Assuming that four high-layer thick metals are covered above the active current source unit whose weight is $W_x$, and areas of the metals are respectively $x_1$, $x_2$, $x_3$, and $x_4$; two high-layer thick metals are covered on the active current source unit whose weight is $W_y$, and areas of the metals are respectively $y_1$ and $y_2$; and one high-layer thick metal is covered on the active current source unit whose weight is $W_z$, and an area of the metal is z. The metal filling areas on the three active current source units in the digital-to-analog converter DAC shown in FIG. 7 have the following relationship:

$$(x_1+x_2+x_3+x_4):(y_1+y_2):z=W_x:W_y:W_z.$$

The metal filling areas on the three active current source units in the digital-to-analog converter DAC shown in FIG. 7 are consistent with the weights of the three active current source units in the DAC. Therefore, the mismatch errors caused by the stress generated by the metals above the three active current source units on lower-layer transistor devices are also consistent with the weight proportional relationship between the three current source units, and a specific relationship formula is as follows:

$$(W_x+\Delta W_x):(W_y+\Delta W_y):(W_z+\Delta W_z)=W_x:W_y:W_z.$$

Therefore, in the circuit layout of the digital-to-analog converter DAC shown in FIG. 7, the high-layer metal density may be filled based on an original weight relationship, to reduce a mismatch error caused by stress, thereby improving precision and performance of the digital-to-analog converter DAC.

In addition, for some digital-to-analog converters DACs, a current source array of each of the DACs includes a relatively large quantity of active current source units. When a metal is filled, not all the active current source units can be filled with a high-layer metal based on a weight proportion. Therefore, according to a circuit layout of each module and a design rule requirement, some active current source units with a relatively high weight proportion may be selected and filled based on a corresponding weight proportion, so as to optimize circuit matching performance.

Figure 8:
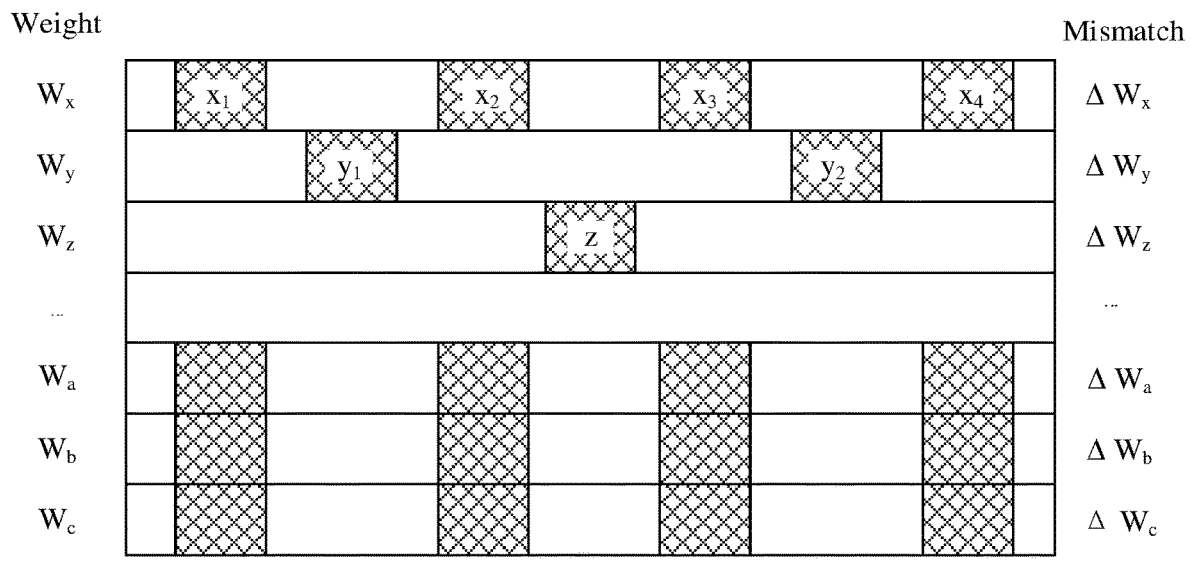
FIG. 8 is a principle diagram 2 of filling a high-layer thick metal on a digital-to-analog converter DAC according to an embodiment of this application.

For example, FIG. 8 shows a principle diagram 2 of filling a high-layer thick metal on a digital-to-analog converter DAC according to an embodiment of this application. As shown in FIG. 8, a plurality of active current source units in the digital-to-analog converter DAC have the following weight proportional relationship:

$$W_x \geq W_y \geq W_z \geq W_a \geq W_b \geq W_c.$$

An active current source unit with a relatively high weight proportion has a relatively large impact on precision of the digital-to-analog converter DAC. Therefore, a high-layer thick metal may be filled on the active current source unit with a relatively high weight proportion based on the weight proportion, thereby optimizing circuit performance. As shown in FIG. 8, high-layer thick metals are filled only above active current sources whose weight proportions are $W_x$, $W_y$, and $W_z$ based on the weight proportional relationship.

The foregoing describes how to reduce the mismatch error caused by the stress. The following provides a description by using high-layer metal filling of current source arrays in two types of current steering DACs as an example.

Figure 9:
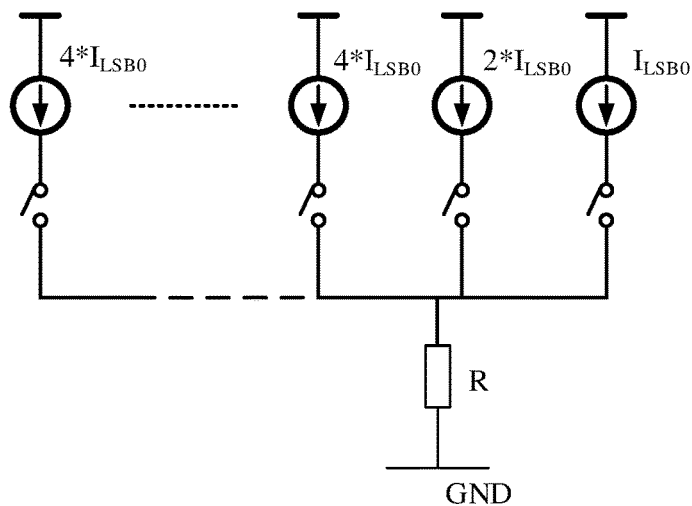
FIG. 9 is a schematic diagram of a structure of a current source array in a current steering DAC according to an embodiment of this application.

A current steering DAC having a binary proportional relationship is used as an example. FIG. 9 shows a schematic diagram of a structure of a current source array in a current steering DAC according to an embodiment of this application. The current steering DAC shown in FIG. 9 is a 6-bit current steering, where four high-order bits are thermometer (T) code and correspond to 15 current sources $I_{MSB}$s, and two low-order bits are binary (B) code and correspond to two current sources $I_{LSB1}$ and $I_{LSB0}$ respectively. A weight proportional relationship between the current sources $I_{MSB}$, $I_{LSB1}$, and $I_{LSB0}$ is a binary proportional relationship. For example, $I_{MSB}:I_{LSB1}:I_{LSB0}=4:2:1$.

Figure 10:
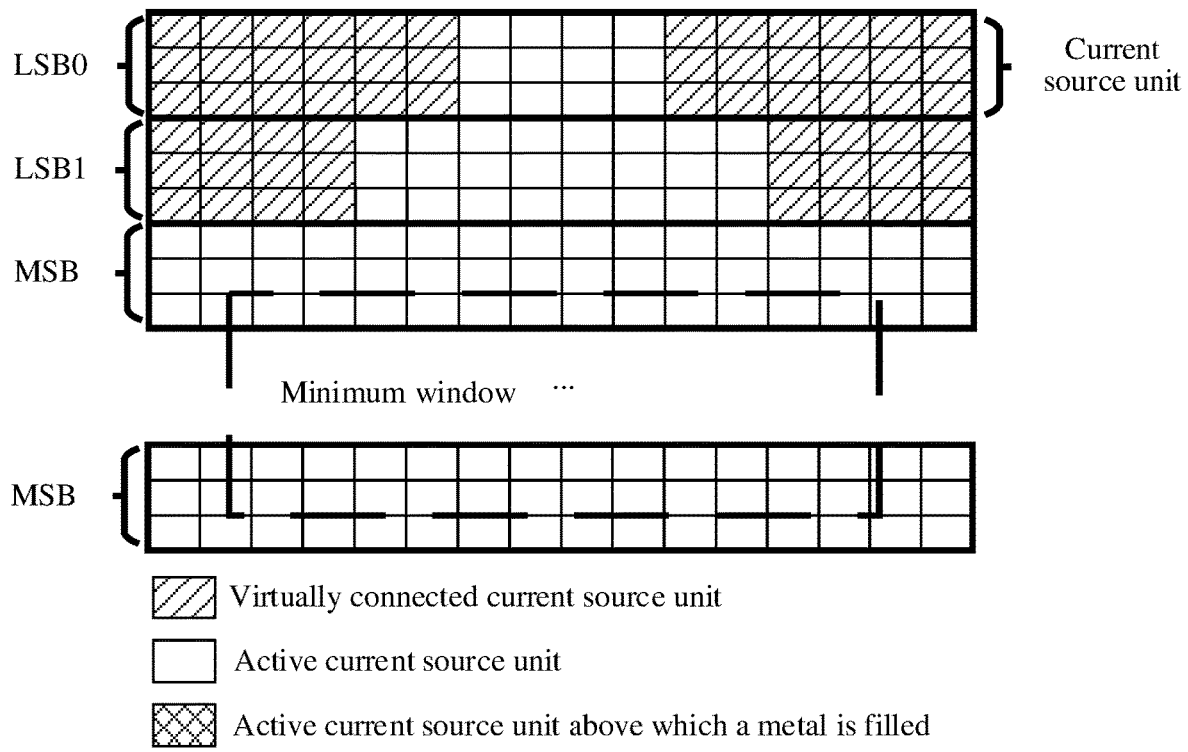
FIG. 10 is a schematic diagram of a circuit layout of the current source array in FIG. 9.

For example, FIG. 10 shows a schematic diagram of a circuit layout of the current source array in FIG. 9. As shown in FIG. 10, a small square represents a transistor with a width (width)/length (length) of W/L, and a current source is formed by 16*3 transistors connected in parallel. All current source units in the current source $I_{MSB}$ are active current source units, and a specific quantity of virtually connected current source units exist on both sides of the current source $I_{LSB1}$ and the current source $I_{LSB0}$. Because the weight proportional relationship between the current sources $I_{MSB}$, $I_{LSB1}$, and $I_{LSB0}$ meets $I_{MSB}:I_{LSB1}:I_{LSB0}=4:2:1$, quantities of transistors in active current source units of the current sources $I_{MSB}$, $I_{LSB1}$, and $I_{LSB0}$ also meet the relationship of 4:2:1.

Figure 11:
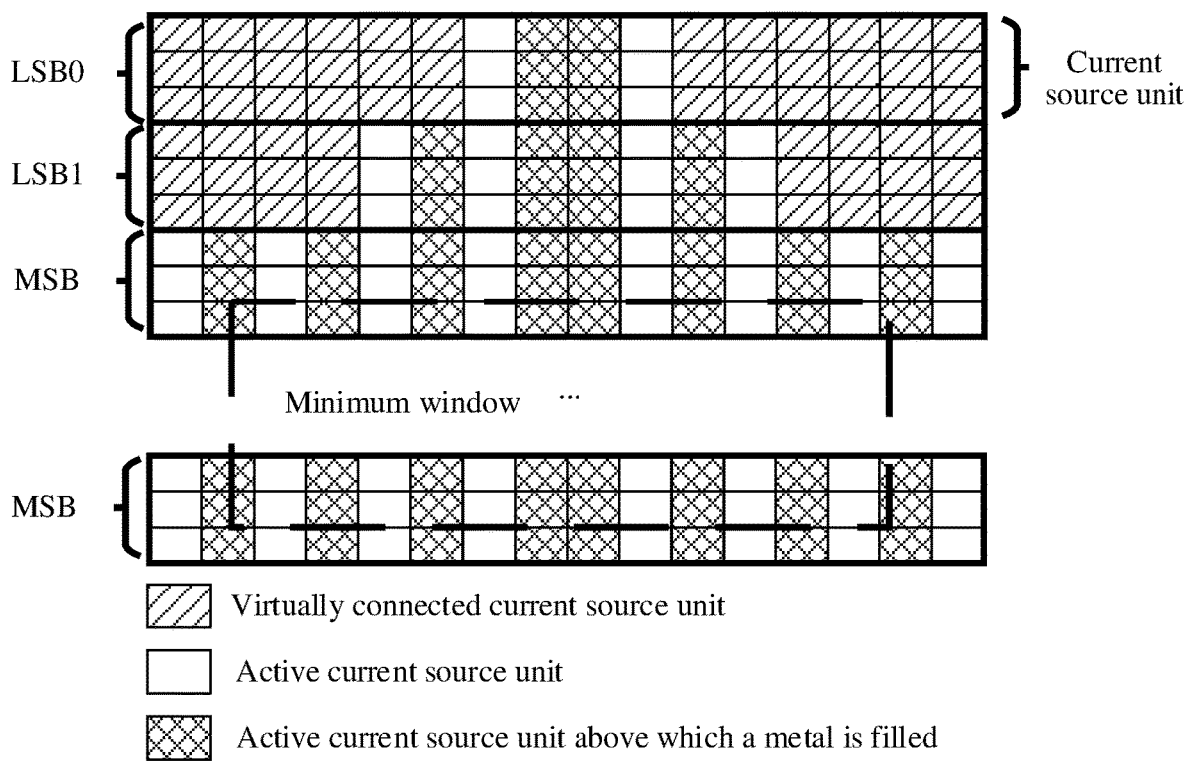
FIG. 11 is a schematic diagram 1 of filling a metal on the circuit layout of the current source array in FIG. 10.
Figure 12:
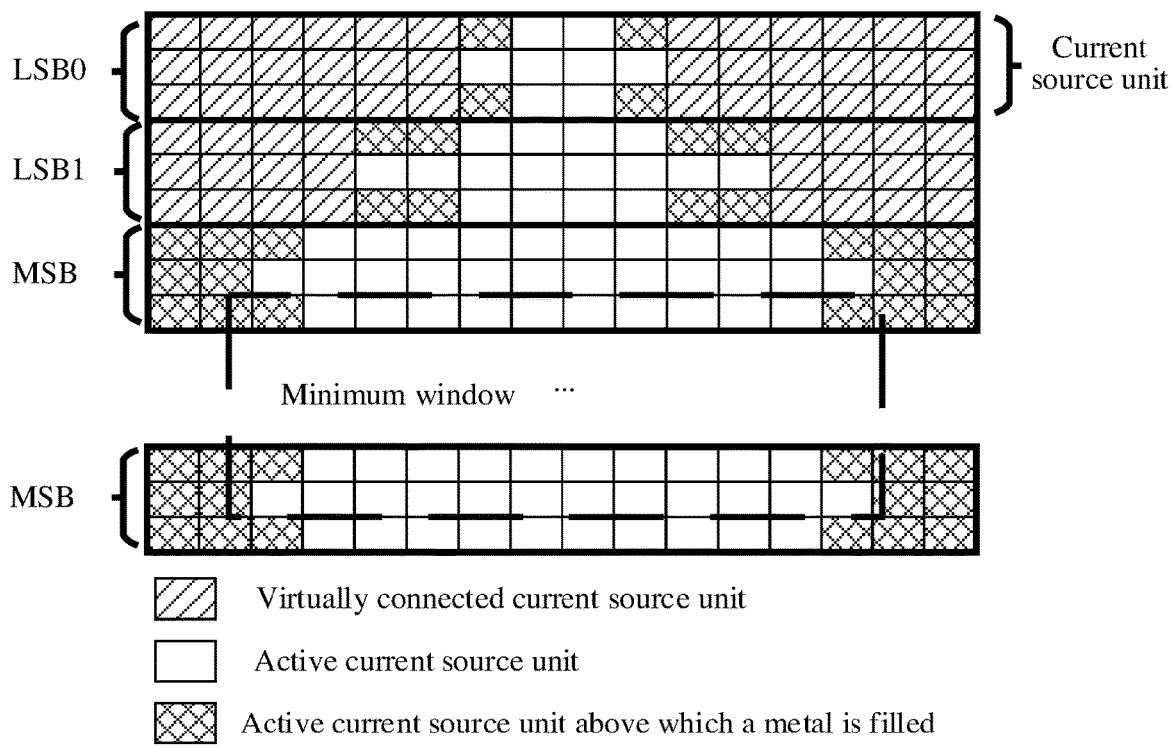
FIG. 12 is a schematic diagram 2 of filling a metal on the circuit layout of the current source array in FIG. 10.

FIG. 11 is a schematic diagram 1 of filling a metal on the circuit layout of the current source array shown in FIG. 10. FIG. 12 is a schematic diagram 2 of filling a metal on the circuit layout of the current source array shown in FIG. 10. As shown in FIG. 11 and FIG. 12, a metal area filled above the current source $I_{MSB}$ is greater than a metal area filled above the current source $I_{LSB1}$; and the metal area filled above the current source $I_{LSB1}$ is greater than a metal area filled above the current source $I_{LSB0}$.

Further, a proportion of the metal area filled above the current source $I_{MSB}$ to the metal area filled above the current source $I_{LSB1}$ is 8:4, that is, 4:2; a proportion of the metal area filled above the current source $I_{MSB}$ to the metal area filled above the current source $I_{LSB0}$ is 8:2, that is, 4:1; a proportion of the metal area filled above the current source $I_{LSB1}$ to the metal area filled above the current source $I_{LSB0}$ is 4:2, that is, 2:1; or a proportion of the metal area filled above the current source $I_{MSB}$, the metal area filled above the current source $I_{LSB1}$, and the metal area filled above the current source $I_{LSB0}$ is 8:4:2. In this way, the proportion of the metal areas filled above the current sources $I_{MSB}$, $I_{LSB1}$, and $I_{LSB0}$ is consistent with the weight proportional relationship between the current sources $I_{MSB}$, $I_{LSB1}$, and $I_{LSB0}$; and the proportion and the weight proportional relationship are both a binary proportional relationship such as 4:2:1.

In some embodiments, a metal filling manner on the active current source unit may be strip-shaped cover filling, or may be dot-shaped filling, or may be a combination of strip-shaped cover filling and dot-shaped filling. For example, the metal filling manner on the active current source unit shown in FIG. 11 is strip-shaped cover filling, that is, the metal may be filled in a strip-shaped manner in a longitudinal or transverse direction along an arrangement direction of transistors in the current source array. For example, the metal filling manner on the active current source unit shown in FIG. 12 is dot-shaped filling. That is, a single transistor in the current source array may be used as a dot, and transistors above which the metal is filled may be randomly arranged, provided that the filled metal area meets a corresponding requirement (for example, meets a binary proportional relationship).

The foregoing uses a DAC having a binary weight proportional relationship as an example for corresponding description, and the following uses a linear weight proportional relationship as an example for description.

Figure 13:
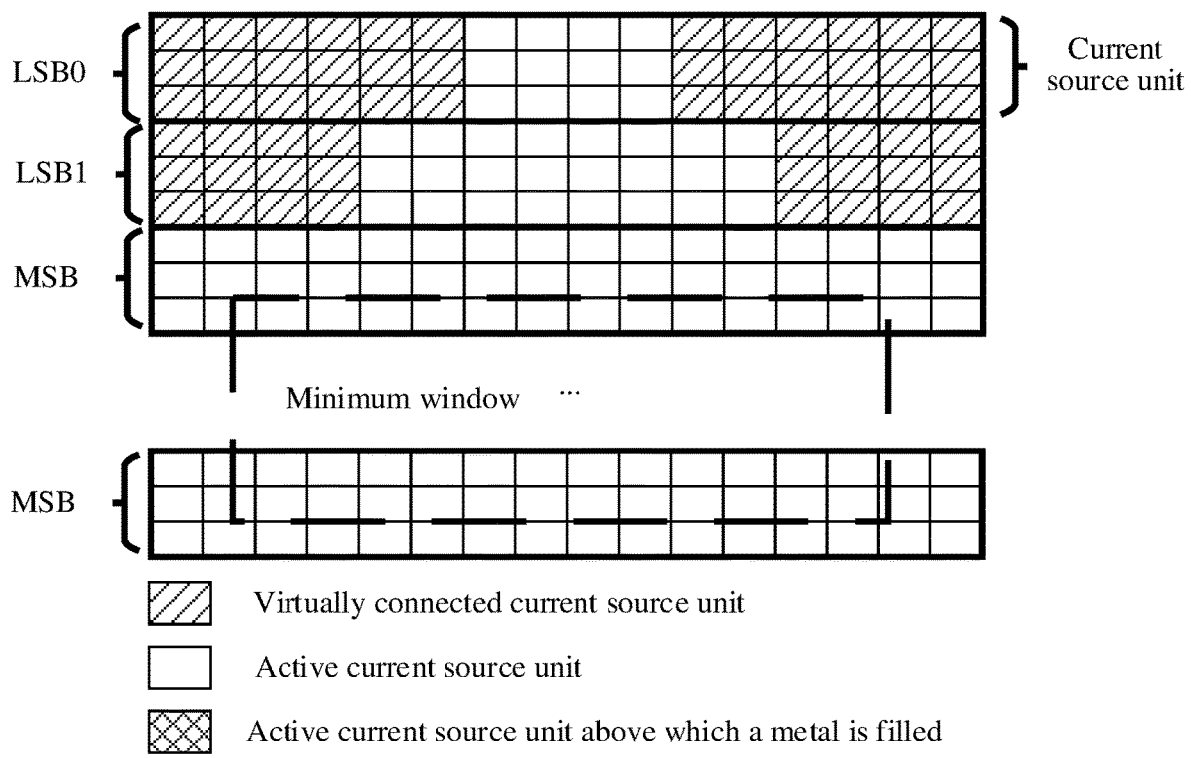
FIG. 13 is a schematic diagram of a circuit layout of a current source array in a DAC having a linear weight relationship according to an embodiment of this application.

For example, FIG. 13 shows a schematic diagram of a circuit layout of a current source array in a DAC having a linear weight proportional relationship. As shown in FIG. 13, four high-order bits of the current source array in the current steering DAC are thermometer code and includes 15 current source units $I_{MSB}$s with a same weight; and three low-order bits of current sources $I_{LSB2}$, $I_{LSB1}$, and $I_{LSB0}$ and the current source unit $I_{MSB}$ meet a linear weight proportional relationship, for example, $I_{MSB}:I_{LSB2}:I_{LSB1}:I_{LSB0}=4:3:2:1$. In FIG. 13, a small square represents a transistor with a W/L (width/length), and a current source is formed by 16*3 transistors connected in parallel. All current source units in the current source $I_{MSB}$ are active current source units, and a specific quantity of virtually connected current source units exist on both sides of the current source $I_{LSB2}$, the current source $I_{LSB1}$, and the current source $I_{LSB0}$. Because the weight proportional relationship between the current sources $I_{MSB}$, $I_{LSB2}$, $I_{LSB1}$, and $I_{LSB0}$ meets $I_{MSB}:I_{LSB2}:I_{LSB1}:I_{LSB0}=4:3:2:1$, quantities of transistors in active current source units of the current sources $I_{MSB}$, $I_{LSB2}$, $I_{LSB1}$, and $I_{LSB0}$ also meet the relationship of 4:3:2:1.

Figure 14:
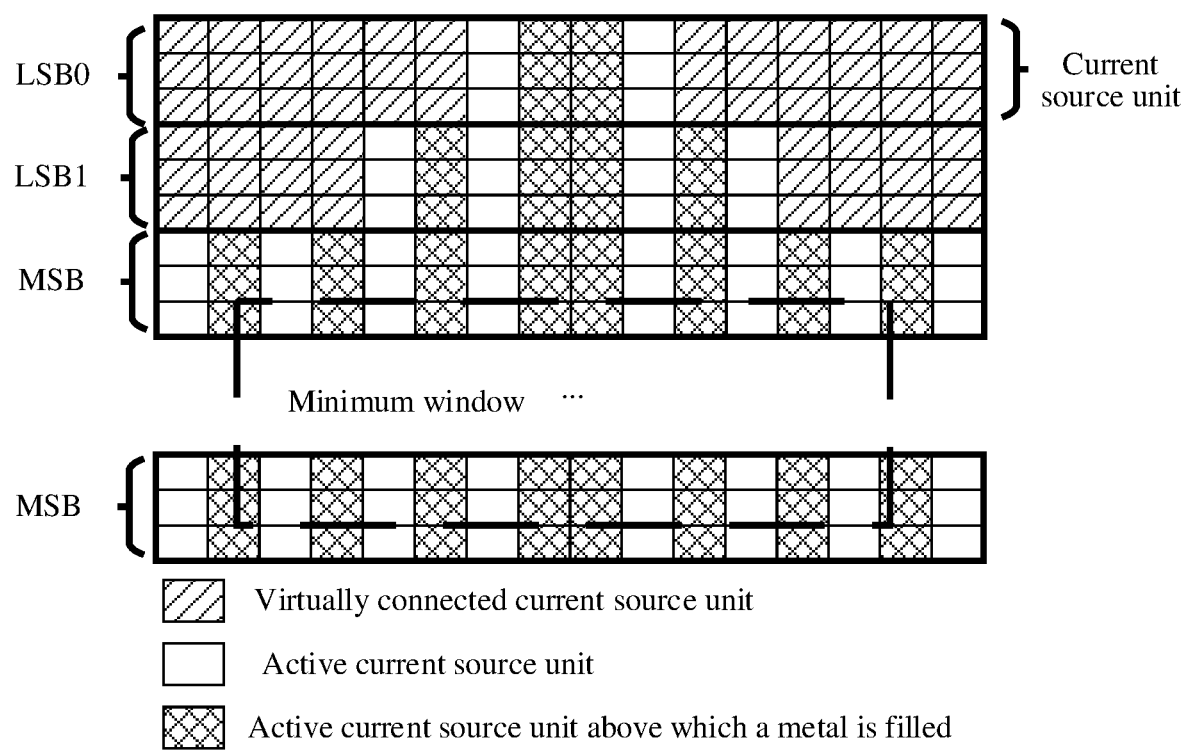
FIG. 14 is a schematic diagram of filling a metal on the circuit layout of the current source array in FIG. 13.

FIG. 14 shows a schematic diagram of filling a metal on the circuit layout of the current source array in FIG. 13. Similar to FIG. 11 and FIG. 12, a proportion of metal areas filled above the current sources $I_{MSB}$, $I_{LSB2}$, $I_{LSB1}$, and $I_{LSB0}$ is consistent with the weight proportional relationship between the current sources $I_{MSB}$, $I_{LSB2}$, $I_{LSB1}$, and $I_{LSB0}$; and the proportion and the weight proportional relationship are both a linear proportional relationship such as 4:3:2:1. A specific filling manner is similar to that in FIG. 11 and FIG. 12, and details are not described herein again.

It should be understood that the weight proportional relationship in the current source array is not limited to a binary weight proportional relationship or a linear weight proportional relationship. Any other weight proportional relationship, for example, a proportion of 4:3:1, is also applicable. A specific value of the weight proportional relationship in the current source array is not specially limited in this embodiment of this application.

In addition, it should be further noted that, a metal density requirement in an integrated circuit design process may be: if a layout area of the current source array exceeds a first threshold, a proportion of a total area of the metals filled above the plurality of active current source units and the plurality of virtually connected current source units to the layout area of the current source array is at least 5%. The first threshold may be an area of a minimum window specified in an advanced process. For example, in both FIG. 10 and FIG. 13, the current source $I_{MSB}$ exceeds the minimum window specified in the advanced process. Therefore, if the area of the metal filled above the virtually connected current source units in the current source array cannot reach at least 5% of the layout area of the current source array, the metal may be filled above the active current source units. That is, a metal may be filled above the current sources $I_{MSB}$, $I_{LSB1}$, and $I_{LSB0}$ in FIG. 10, as shown in FIG. 11 and FIG. 12. Alternatively, a metal may be filled above the current sources $I_{MSB}$, $I_{LSB2}$, $I_{LSB1}$, and $I_{LSB0}$ in FIG. 13, as shown in FIG. 14, so as to meet the metal density requirement in the integrated circuit design process, thereby improving circuit reliability.

An embodiment of this application further provides an integrated circuit. The integrated circuit may be the digital-to-analog converter DAC in the foregoing embodiments, or may include both the digital-to-analog converter DAC in the foregoing embodiments and include another type of circuit, such as an analog-to-digital converter (ADC).

It should be understood that the DAC described in the foregoing embodiments may be all or some functional modules of a chip DAC circuit, and the active current sources filled with the top layer metal may be all or some current sources in the DAC.

Figure 15:
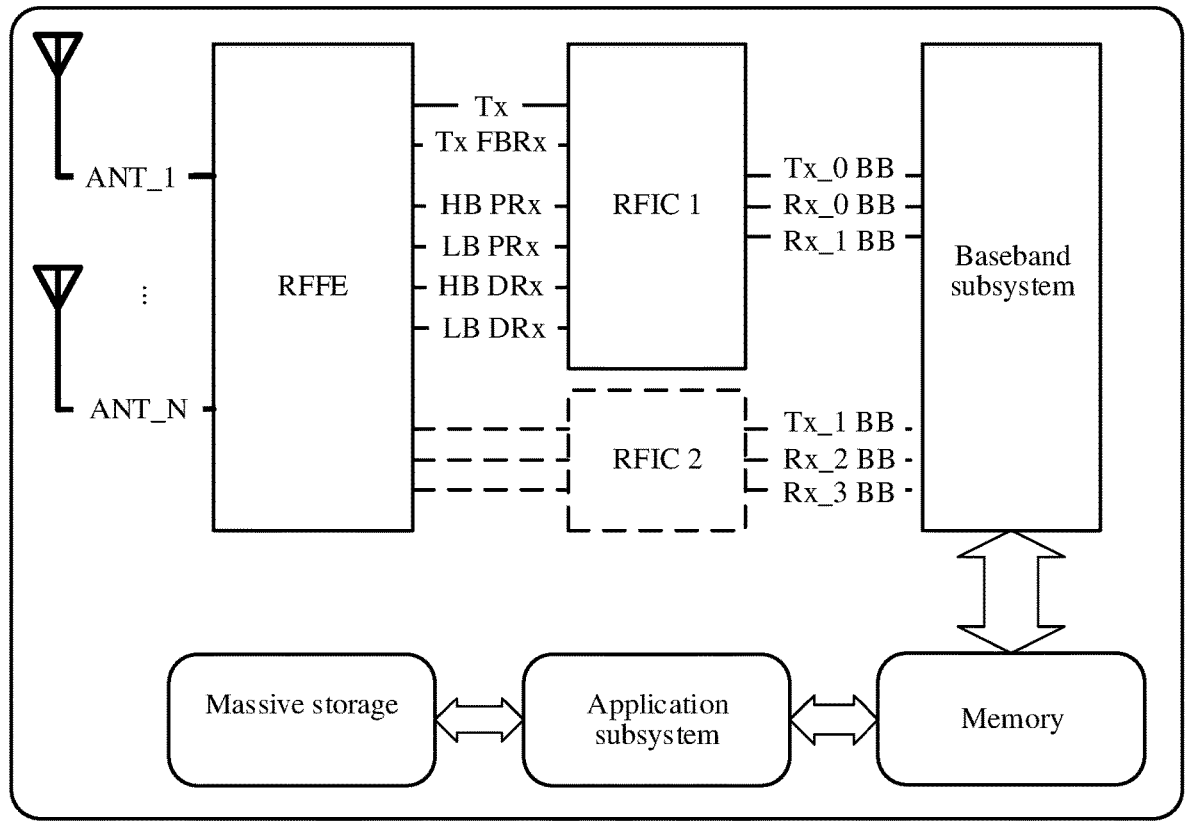
FIG. 15 is a schematic diagram of a structure of an electronic device according to an embodiment of this application.

FIG. 15 shows a schematic diagram of a structure of an electronic device according to an embodiment of this application. The electronic device may be a terminal or a base station. As shown in FIG. 15, the electronic device may include an application subsystem, a memory, a mass storage, a baseband subsystem, a radio frequency integrated circuit (RFIC), a radio frequency front end (RFFE) component, and an antenna (ANT), which may be coupled by using various interconnection buses or other electrical connection manners.

In FIG. 15, ANT_1 represents a first antenna, ANT_N represents an $N^{th}$ antenna, and N is a positive integer greater than 1. Tx indicates a transmit path, Rx indicates a receive path, and different numbers indicate different paths. FBRx represents a feedback receive path, PRx represents a primary receive path, and DRx represents a diversity receive path. HB indicates a high frequency, LB indicates a low frequency, and HB and LB indicate relative magnitudes of frequencies. BB indicates a baseband. It should be understood that the marks and components in FIG. 15 are merely for the purpose of illustration, and are merely used as a possible implementation. This embodiment of this application further includes other implementations.

The application subsystem may be used as a main control system or a main computing system of a wireless communication device, and is configured to run a main operating system and an application program, manage software and hardware resources of the entire wireless communication device, and provide a user operation interface for a user. The application subsystem may include one or more processing cores. In addition, the application subsystem may also include driver software related to another subsystem (for example, the baseband subsystem). The baseband subsystem may also include one or more processing cores, a hardware accelerator (hardware accelerator, HAC), and a cache.

In FIG. 15, the RFFE component and the RFIC 1 (and optionally the RFIC 2) may form a radio frequency subsystem together. The radio frequency subsystem may be further divided into a radio frequency receive path (RF receive path) and a radio frequency transmit path (RF transmit path). The radio frequency receive path may receive a radio frequency signal by using the antenna, perform processing (for example, amplification, filtering, and down-conversion) on the radio frequency signal to obtain a baseband signal, and transmit the baseband signal to the baseband subsystem. The radio frequency transmit path may receive a baseband signal from the baseband subsystem, perform radio frequency processing (such as up-conversion, amplification, and filtering) on the baseband signal to obtain a radio frequency signal, and finally radiate the radio frequency signal into space by using the antenna. Specifically, the radio frequency subsystem may include electronic device such as an antenna switch, an antenna tuner, a low noise amplifier (low noise amplifier, LNA), a power amplifier (power amplifier, PA), a mixer (mixer), a local oscillator (local oscillator, LO), and a filter (filter), and the electronic devices may be integrated into one or more chips as required. Sometimes, the antenna may also be considered as a part of the radio frequency subsystem.

The baseband subsystem may extract useful information or data bits from a baseband signal, or convert information or data bits into a to-be-sent baseband signal. The information or data bits may be data representing user data or control information such as voice, text, and a video. For example, the baseband subsystem may implement signal processing operations such as modulation and demodulation, and coding and decoding. Different radio access technologies, such as 5G NR and 4G LTE, usually have baseband signal processing operations that are not completely the same. Therefore, to support convergence of a plurality of mobile communication modes, the baseband subsystem may simultaneously include a plurality of processing cores or a plurality of HACs.

In addition, because the radio frequency signal is an analog signal, and signals processed by the baseband subsystem are mainly digital signals, an analog-to-digital conversion device is further required in the wireless communication device. The analog-to-digital conversion device includes an analog-to-digital converter (analog-to-digital converter, ADC) that converts an analog signal into a digital signal, and a digital-to-analog converter (digital-to-analog converter, DAC) that converts a digital signal into an analog signal. The digital-to-analog converter DAC provided in the foregoing embodiments may be used as the digital-to-analog converter. In this embodiment of this application, the analog-to-digital conversion device may be disposed in the baseband subsystem, or may be disposed in the radio frequency subsystem, that is, a transceiver chip.

It should be understood that, in this embodiment of this application, the processing core may represent a processor, and the processor may be a general-purpose processor, or may be a processor designed for a specific field. For example, the processor may be a central processing unit (center processing unit, CPU), or may be a digital signal processor (digital signal processor, DSP). The processor may also be a micro control unit (micro control unit, MCU), a graphics processing unit (graphics processing unit, GPU), an image signal processor (image signal processor, ISP), an audio signal processor (audio signal processor, ASP), or a processor specifically designed for an artificial intelligence (artificial intelligence, AI) application. The AI processor includes but is not limited to a neural network processing unit (neural network processing unit, NPU), a tensor processing unit (tensor processing unit, TPU), and a processor referred to as an AI engine.

The hardware accelerator may be configured to implement some sub-functions with relatively high processing overheads, for example, data packet (data packet) assembly and parsing, and data packet encryption and decryption. The sub-functions may also be implemented by a processor with a general function, but the hardware accelerator may be more appropriate for performance or cost considerations. Therefore, a type and a quantity of hardware accelerators may be specifically selected based on a requirement. In a specific implementation, the hardware accelerator may be implemented by using one or a combination of a field programmable gate array (field programmable gate array, FPGA) and an application-specific integrated circuit (application-specified integrated circuit, ASIC). Certainly, the hardware accelerator may alternatively use one or more processing cores.

The memory may be divided into a volatile memory (volatile memory) and a non-volatile memory (non-volatile memory, NVM). The volatile memory refers to a memory in which data stored inside is lost when a power supply is interrupted. Currently, the volatile memory is mainly a random access memory (random access memory, RAM), including a static random access memory (static RAM, SRAM) and a dynamic random access memory (dynamic RAM, DRAM). The non-volatile memory refers to a memory in which data stored inside is not lost even if a power supply is interrupted. A common non-volatile memory includes a read-only memory (read-only memory, ROM), an optical disc, a magnetic disk, and various memories based on a flash memory (flash memory) technology. Generally, the volatile memory may be selected as a memory, and the non-volatile memory, such as a magnetic disk or a flash memory, may be selected as a massive storage.

In this embodiment of this application, the baseband subsystem and the radio frequency subsystem together form a communication subsystem, to provide a wireless communication function for the wireless communication device. Generally, the baseband subsystem is responsible for managing software and hardware resources of the communication subsystem, and may configure working parameters of the radio frequency subsystem. The one or more processing cores of the baseband subsystem may be integrated into one or more chips, and the chip may be referred to as a baseband processing chip or a baseband chip. Similarly, the RFIC may be referred to as a radio frequency processing chip or a radio frequency chip. In addition, with evolution of technologies, function division of the radio frequency subsystem and the baseband subsystem in the communication subsystem may also be adjusted. For example, some functions of the radio frequency subsystem are integrated into the baseband subsystem, or some functions of the baseband subsystem are integrated into the radio frequency subsystem. In an actual application, based on a requirement of an application scenario, the wireless communication device may use a combination of different quantities and different types of processing cores.

In this embodiment of this application, the radio frequency subsystem may include an independent antenna, an independent radio frequency front end (RF front end, RFFE) component, and an independent radio frequency chip. The radio frequency chip is also sometimes referred to as a receiver (receiver), a transmitter (transmitter), a transceiver (transceiver), or a transceiver chip. The antenna, the radio frequency front end component, and the RF processing chip may be manufactured and sold independently. Certainly, the radio frequency subsystem may alternatively use different components or different integration manners based on requirements of power consumption and performance. For example, some components belonging to the radio frequency front end are integrated into the radio frequency chip, or even both the antenna and the radio frequency front end component are integrated into the radio frequency chip. The radio frequency chip may also be referred to as a radio frequency antenna module or an antenna module.

In this embodiment of this application, the baseband subsystem may be used as an independent chip, and the chip may be referred to as a modem (modem) chip. Hardware components of the baseband subsystem may be manufactured and sold in the unit of the modem chip. The modem chip is also sometimes referred to as a baseband processing chip or a baseband processor. In addition, the baseband subsystem may be further integrated into an SoC chip, and manufactured and sold in the unit of the SoC chip. Software components of the baseband subsystem may be built in hardware components of a chip before the chip is delivered, or may be imported from another non-volatile memory to hardware components of a chip after the chip is delivered, or may be downloaded and updated online by using a network.

In addition, the electronic device may further include a printed circuit board, and the transceiver chip and the baseband processing chip are disposed on the printed circuit board.

Figure 16:
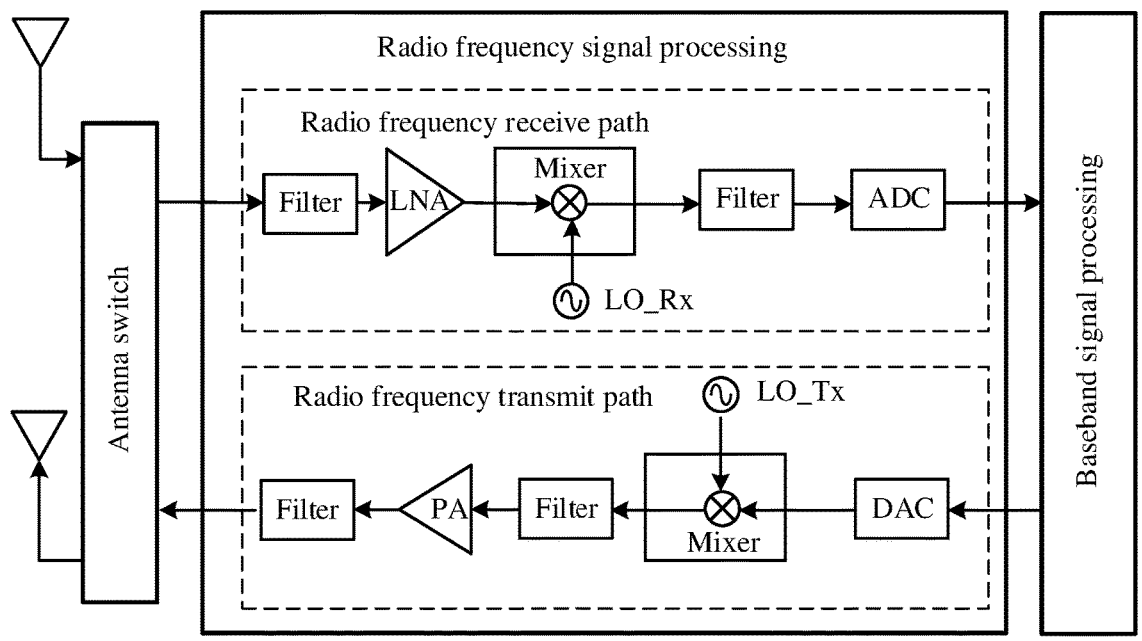
FIG. 16 is a schematic diagram of a structure of another electronic device according to an embodiment of this application.

FIG. 16 is a schematic diagram of a structure of another electronic device according to an embodiment of this application. FIG. 16 shows some common components used for radio frequency signal processing in an electronic device. It should be understood that although only one radio frequency receive path and one radio frequency transmit path are shown in FIG. 16, the wireless communication device in this embodiment of this application is not limited thereto. The wireless communication device may include one or more radio frequency receive paths and one or more radio frequency transmit paths.

For the radio frequency receive path, a radio frequency signal received from an antenna is sent to the radio frequency receive path through selection by an antenna switch. Because the radio frequency signal received from the antenna is usually very weak, the radio frequency signal is usually amplified by using a low noise amplifier LNA. The amplified signal is first down-converted by a mixer, and then passes through a filter and an analog-to-digital converter (ADC), and finally baseband signal processing is completed on the signal. For the radio frequency transmit path, a baseband signal may be converted into an analog signal by using a digital-to-analog converter DAC, the analog signal is converted into a radio frequency signal by up-conversion processing performed by the mixer, and the radio frequency signal is processed by the filter and a power amplifier PA, and finally radiated outwards from a suitable antenna through selection by the antenna switch. The digital-to-analog converter DAC provided in the foregoing embodiments may be used as the digital-to-analog converter DAC of the radio frequency transmit path.

In the mixer, an input signal and an LO signal of a local oscillator are mixed, so that an up-conversion (corresponding to the radio frequency transmit path) or a down-conversion (corresponding to the radio frequency receive path) operation may be implemented. The local oscillator LO is a common term in the radio frequency field, and is usually referred to as LO for short. The LO is also sometimes referred to as a frequency combiner or a frequency synthesizer, which is referred to as FS for short. A main function of the LO or FS is to provide a specific frequency, for example, a carrier frequency, for radio frequency processing. A higher frequency may be implemented by using a device such as a phase-locked loop (phase-locked loop, PLL) or a delay-locked loop (delay-locked loop, DLL). A lower frequency may be implemented by directly using a crystal oscillator or dividing a high frequency signal generated by a device such as a PLL.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A digital-to-analog converter, comprising:
a current source array and a switch array, wherein:
the current source array comprises a plurality of active current source units;
a metal is filled above the plurality of active current source units, wherein the metal generates stress applied to the plurality of active current source units;
the switch array comprises a plurality of switch units, wherein:
control ends of the plurality of switch units are configured to receive control signals; and
input ends of the plurality of switch units are configured to receive corresponding currents provided by the plurality of active current source units; and
output ends of the plurality of switch units are coupled to an output end of the digital-to-analog converter, wherein the output ends are configured to output analog signals.

2. The digital-to-analog converter according to claim 1, wherein:
the current source array further comprises a plurality of virtually connected current source units; and
a metal is filled above the plurality of virtually connected current source units.

3. The digital-to-analog converter according to claim 1, wherein the metal filled above the plurality of active current source units comprises at least one of a top layer metal or a sub-top layer metal.

4. The digital-to-analog converter according to claim 1, wherein:
the plurality of active current source units have a weight proportional relationship; and
weights of the plurality of active current source units are related to at least one of a quantity of transistors in the plurality of active current source units or sizes of the transistors in the plurality of active current source units.

5. The digital-to-analog converter according to claim 1, wherein:
the plurality of switch units have a weight proportional relationship; and
weights of the plurality of switch units are related to at least one of a quantity of transistors in the plurality of switch units or sizes of the transistors in the plurality of switch units.

6. The digital-to-analog converter according to claim 1, wherein:
the current source array comprises a first active current source unit and a second active current source unit, wherein the first active current source unit has a first weight and the second active current source unit has a second weight, wherein the first weight is greater than or equal to the second weight, and, at a same metal layer, a metal filling area on the first active current source unit is greater than or equal to a metal filling area on the second active current source unit.

7. The digital-to-analog converter according to claim 6, wherein at a same metal layer, a proportional relationship between the metal filling area on the first active current source unit and the metal filling area on the second active current source unit is consistent with a proportional relationship between the first weight and the second weight.

8. The digital-to-analog converter according to claim 6, wherein:
the current source array further comprises a third active current source unit, and the third active current source unit has a third weight; and
the third weight is less than the second weight, and, at a same metal layer, a metal filling area on the third active current source unit is less than the metal filling area on the second active current source unit.

9. The digital-to-analog converter according to claim 8, wherein, at a same metal layer, a proportional relationship between the metal filling area on the first active current source unit, the metal filling area on the second active current source unit, and the metal filling area on the third active current source unit is consistent with a proportional relationship between the first weight, the second weight, and the third weight.

10. The digital-to-analog converter according to claim 9, wherein the proportional relationship between the first weight, the second weight, and the third weight is a binary proportional relationship.

11. The digital-to-analog converter according to claim 1, wherein a metal filling manner on the active current source units is at least one of strip-shaped cover filling or dot-shaped filling.

12. The digital-to-analog converter according to claim 2, wherein if a layout area of the current source array exceeds a first threshold, a proportion of a total area of the metals filled above the plurality of active current source units and the plurality of virtually connected current source units to the layout area of the current source array is at least 5%.

13. An electronic device, comprising:
a transceiver chip and a digital-to-analog converter, wherein the digital-to-analog converter is disposed in the transceiver chip, and wherein the digital-to-analog converter comprises:
a current source array and a switch array, wherein the current source array comprises a plurality of active current source units;
a metal is filled above the plurality of active current source units, wherein the metal generates stress applied to the plurality of active current source units,
the switch array comprises a plurality of switch units, wherein control ends of the plurality of switch units are configured to receive control signals, and wherein input ends of the plurality of switch units are configured to receive corresponding currents provided by the plurality of active current source units; and
output ends of the plurality of switch units are coupled to an output end of the digital-to-analog converter, and are configured to output analog signals.

14. The electronic device according to claim 13, further comprising a baseband processing chip, wherein the baseband processing chip is coupled to the transceiver chip.

15. The electronic device according to claim 14, further comprising a printed circuit board, wherein the transceiver chip and the baseband processing chip are disposed on the printed circuit board.

16. The electronic device according to claim 13, wherein:
the current source array further comprises a plurality of virtually connected current source units; and
a metal is filled above the plurality of virtually connected current source units.

17. The electronic device according to claim 13, wherein the metal filled above the plurality of active current source units comprises at least one of a top layer metal or a sub-top layer metal.

18. The electronic device according to claim 13, wherein:
the plurality of active current source units have a weight proportional relationship; and
weights of the plurality of active current source units are related to a quantity of transistors in the plurality of active current source units or sizes of the transistors in the plurality of active current source units.

19. The electronic device according to claim 13, wherein:
the plurality of switch units have a weight proportional relationship; and
weights of the plurality of switch units are related to a quantity of transistors in the plurality of switch units or sizes of the transistors in the plurality of switch units.

20. The electronic device according to claim 13, wherein:
the current source array comprises a first active current source unit and a second active current source unit, the first active current source unit has a first weight, and the second active current source unit has a second weight; and
the first weight is greater than or equal to the second weight, and at a same metal layer, a metal filling area on the first active current source unit is greater than or equal to a metal filling area on the second active current source unit.

* * * * *